United States Patent
Barabi et al.

(10) Patent No.: US 11,906,550 B2
(45) Date of Patent: Feb. 20, 2024

(54) PROBE SYSTEM FOR QFP INTEGRATED CIRCUIT DEVICE TEST TOOLING

(71) Applicant: ESSAI, INC., Fremont, CA (US)

(72) Inventors: Nasser Barabi, Lafayette, CA (US); Oksana Kryachek, San Francisco, CA (US); Hin Lum Lee, Fremont, CA (US); Chee Wah Ho, Chandler, AZ (US)

(73) Assignee: ESSAI, INC., Fremont, CA (US)

( * ) Notice: Subject to any disclaimer, the term of this patent is extended or adjusted under 35 U.S.C. 154(b) by 0 days.

(21) Appl. No.: 17/515,371

(22) Filed: Oct. 29, 2021

(65) Prior Publication Data

US 2022/0349918 A1    Nov. 3, 2022

Related U.S. Application Data

(60) Provisional application No. 63/182,733, filed on Apr. 30, 2021.

(51) Int. Cl.
*G01R 1/067* (2006.01)
*G01R 31/28* (2006.01)
*G01R 1/073* (2006.01)

(52) U.S. Cl.
CPC ..... *G01R 1/06738* (2013.01); *G01R 1/07342* (2013.01); *G01R 31/2886* (2013.01)

(58) Field of Classification Search
CPC ............ G01R 1/06738; G01R 1/07342; G01R 31/2886
See application file for complete search history.

(56) References Cited

U.S. PATENT DOCUMENTS

| | | | |
|---|---|---|---|
| 2008/0150569 A1* | 6/2008 | Barabi | G01R 1/0483 324/755.05 |
| 2008/0204061 A1* | 8/2008 | Chartarifsky | G01R 1/07342 324/755.05 |
| 2021/0247421 A1* | 8/2021 | Ohshima | G01R 1/073 |
| 2022/0026481 A1* | 1/2022 | Ota | G01R 1/06722 |
| 2022/0326280 A1* | 10/2022 | Sim | G01R 1/06738 |

FOREIGN PATENT DOCUMENTS

WO    WO-2018042931 A1 *    3/2018

OTHER PUBLICATIONS

English Machine Translation of Takamori WO 2018042931 (Year: 2018).*

* cited by examiner

*Primary Examiner* — Lee E Rodak
(74) *Attorney, Agent, or Firm* — Kang S. Lim (57) ABSTRACT

An automated high speed test solution for Quad Flat Pack device packages that enables connectivity between test equipment and the integrated circuit under test is described. A test probe geometry that provides highly repeatable and reliable connections suitable for use with consumer grade QFP devices coupled with ease of maintenance is provided. In some embodiments, the probe tip ends are chisel-shaped. The probes can be slightly slanted with respect to a vertical axis of the probe retaining block.

6 Claims, 9 Drawing Sheets

PROBE SYSTEM FOR QFP INTEGRATED CIRCUIT DEVICE TEST TOOLING

CROSS-REFERENCE TO RELATED APPLICATION

This application claims the benefit and priority of U.S. Provisional Application No. 63/182,733, filed Apr. 30, 2021, pending, which is incorporated herein in its entirety by this reference.

BACKGROUND

The present invention relates to systems and methods for reliable test tooling for packaged integrated circuits (IC) devices. In particular, improved probe structures and fittings for Quad Flat Pack IC device test tooling are provided.

Test socketing solutions for packaged IC devices have been subject to deviation and inconsistency in connection capability of the contact point and hence electrical continuity due to life cycle wear and tear stresses. These unavoidable effects have continued to instigate invalid test failures, higher retest rates, higher test-tooling down-time and resulting higher IC device test costs. High performance packaging for integrated circuits having a large number of connections requires dense packing of contact points and in many of these cases, they are located at one or both of the top and bottom of the package in the form of a grid array.

Although most signal connections are able to tolerate some deterioration in the series resistance introduced as probe assemblies wear, grounding connections are far less tolerant of the introduction of series resistance, since ground currents can cause crosstalk between signal connections as well as signal distortion. This latter aspect of the effects of resistive elements is fairly broadband and more or less independent of frequency; skin effect, wherein the current flow is not in the bulk of the conductor but in a thin layer of the surface, contributes somewhat, but for small signals can usually be treated as a second order concern. Test-jigs are intended to be used for characterization and qualification so are expected to produce reliable and repeatable results for any of the device-under-test (DUT) parameters in a single process. This differs from the use of that same DUT in an actual application where the device external parameters such as voltages and currents are fixed at the prototyping stage and thereafter the only significant variable is the device itself. Where a precision contact array is provided, probes having a pointed end can be used to cause sufficient pressure to be able to penetrate oxidation or coating that may be present at contact areas. By setting the probes at a slight angle to the parts under test displacement of the probe contact point causes a lateral motion as well and this added scraping action improves the quality of the contact at the cost of some wear in the probe element itself.

Contact probes of test tooling for testing IC devices are generally made from conductive metals and metallic alloys such as BeCu, brass and steel alloys. Depending on the specific applications, these contact probes can be coated and/or plated with a suitable conductive material such as gold, iridium, nickel, palladium and cobalt to provide a low resistance unaffected by oxidation, especially at the higher frequencies where skin effect dominates the current flow and then passivated with a suitable insulating layer to avoid short circuits in the jig itself.

However, during repetitive testing of the IC devices, e.g., after 100,000 test cycles, these contact probes of the test tooling will have been impacted continually by repeated connection to and disconnection from the IC devices under test. As a result, the contact probes are often subjected to contact deterioration as a result of plated conductive layer peel-off, metal oxidation and foreign material adhesion, leading to substantive contact capability degradation. Although signal connections can be tolerant of the introduction of resistance into the circuit when small currents are involved, regions of high current flow such as shared ground connections represent a serious problem. These physical changes, in addition to introducing resistive changes in the current paths also cause changes to the reactive elements of the circuit and this will result in a changed input signal which varies with frequency.

Furthermore, after repeated continual testing of IC devices described above, the penetration capability of the test tooling contact probes are also affected by the substantial loss of inherent compliant force generated by spring or elastic elements housed by the corresponding contact probe body or column. This problem is exacerbated by IC devices' reduced contact pitch sizes, and with commercial quality devices that are manufactured so as to have pins located on the edges of the packaging, such as a quad flat pack, the variability in contact location presents a new category of problem beyond that of needing to penetrate an oxidized layer on the surface of the pin.

It is apparent that an urgent need exists for improved performance of the contact probes of IC test tooling which is intended for devices having a high density of pins located at the edges of the package after repeated testing cycles. This improved probe performance enables more reliable testing of the ever-shrinking IC devices for extended periods without any unnecessary downtime of IC test tooling associated with failure or substantial degradation of contact probes.

SUMMARY

To achieve the foregoing and in accordance with the present invention, systems and methods for reliable testing of packaged high speed integrated circuit (IC) devices having high pin densities at the edges of the package is provided.

In one embodiment, a test probe assembly is configured for testing packaged Quad Flat Pack (QFP) integrated circuit (IC) devices. The test probe assembly includes a plurality of probes or pins, a termination pad interposer that allows the test probes or pins to be connected at one side to the testing equipment as well as a docking component that assures repeatable alignment of the device under test. The docking component further includes a pressure pad that provides support to the pins of the QFP device to prevent pin distortion as a result of being displaced by the contact pressure of the probes. The plurality of probes is configured to repeatedly maintain reliable electrical contact with a corresponding plurality of contacts on the Device Under Test (DUT) when under a compliant force. An interposing pad provides mechanical and electrical coupling for the plurality of probes and further provides a point of termination for cabling from the various test equipment used to transmit and receive signals from the DUT. The interposing pad may also incorporate reactive elements including sections of transmission lines to provide for proper matching or cancellation of some or all of those parasitic reactances introduced by the test jig.

Note that the various features of the present invention described above may be practiced alone or in combination. These and other features of the present invention will be described in more detail below in the detailed description of the invention and in conjunction with the following figures.

BRIEF DESCRIPTION OF THE DRAWINGS

In order that the present invention may be more clearly ascertained, some embodiments will now be described, by way of example, with reference to the accompanying drawings, in which.

DETAILED DESCRIPTION

The present invention will now be described in detail with reference to several embodiments thereof as illustrated in the accompanying drawings. In the following description, numerous specific details are set forth in order to provide a thorough understanding of embodiments of the present invention. It will be apparent, however, to one skilled in the art, that embodiments may be practiced without some or all of these specific details. In other instances, well known process steps and/or structures have not been described in detail in order to not unnecessarily obscure the present invention. The features and advantages of embodiments may be better understood with reference to the drawings and discussions that follow.

Aspects, features and advantages of exemplary embodiments of the present invention will become better understood with regard to the following description in connection with the accompanying drawing(s). It should be apparent to those skilled in the art that the described embodiments of the present invention provided herein are illustrative only and not limiting, having been presented by way of example only. All features disclosed in this description may be replaced by alternative features serving the same or similar purpose, unless expressly stated otherwise. Therefore, numerous other embodiments of the modifications thereof are contemplated as falling within the scope of the present invention as defined herein and equivalents thereto. Hence, use of absolute and/or sequential terms, such as, for example, "will," "will not," "shall," "shall not," "must," "must not," "first," "initially," "next," "subsequently," "before," "after," "lastly," and "finally," are not meant to limit the scope of the present invention as the embodiments disclosed herein are merely exemplary.

The present invention relates to systems and methods for improved contact probes of reliable test tooling for packaged Integrated Circuit (IC) devices using edge mounted connection pins in accordance with Quad Flat Pack layouts. These types of devices are intended for high density, or pin count, circuits intended for volume assembly using conventional soldering techniques that are commonly used for the manufacture of consumer electronic appliances. Historically, early integrated circuits were packaged using a row of pins at a defined spacing of 0.1" and although there are examples of "single in line" packaged devices for passive components, active devices were more usually packaged in a "dual in line" package. The physical size of the packaged device depended on the device complexity in terms of the number of input, output and power supply connections required. As the pin count increased, the circuit board area required for such packaged devices forced a change to use not just the two edges of a package, but also the use of the two ends as well. Coupled with the task of area minimization, the result is a four sided approximately square package having pins along each edge. Common sizes are from 32 QFP having 8 pins per edge, to 304 QFP having 76 pins per edge. The distance between pin centers is generally between 0.4 mm and 1 mm (from about 0.015" to 0.040") and of course as this dimension gets small, the pins become more fragile and prone to distortion. A working limit to the lower dimensions is the susceptibility of the soldering process to forming solder bridges, though for modern surface mount techniques this is an acceptably small risk. Automatic testing requires that no damage is caused to the pin geometry by the testing apparatus so provision must be made to ensure that probe pressure is countered by an appropriate support mechanism for the pins.

Probes of the types described in this document normally allow a complex suite of test equipment that often comprises power supplies, signal sources or generators, data gathering equipment and analysis equipment to be connected to integrated circuits having a large number of connections. The test equipment may be hard-wired to any test probe assemblies but modern implementations of testers routinely terminate the equipment on a termination plate or board, an interposing pad, which is then attached to the assembly that contains the probes. In this way one end of the pins that make up the probe assembly is coupled to the termination board leaving the other end ready for connecting to the devices under test. An important aspect to be borne in mind is that automated test equipment is intended to test a very large number of devices and so the need for repetitive connection and disconnection with high repeatability and reliability is a foundation design consideration.

Repeated connection and disconnection entails wear on the pin assemblies in the probing station with which they are associated and a consequence of this wear is to create variability in the quality of the connections to the DUT. Deterioration of the test jig whether mechanical or electrical is problematic since the resulting improper rejection of a part being tested has serious cost implications, especially with modern, high density technologies. The actual pin layout and distribution of the pin density is of course dictated by the individual component part to be tested. By constructing the termination board for the test equipment separately from the probe assembly containing the contact pins it becomes feasible to change the probe assembly efficiently either when the pins begin to wear or on a planned maintenance schedule and thus avoid unplanned lost production in the testing equipment; it is worth noting that the connection between the probe assembly and the interposing pad is only changed when a new probe assembly is positioned as a replacement for the old worn part. As mentioned, the goal of this invention is to provide a mechanism for improving the performance of the test jig assembly that comprises the contact pins and their mounting jig.

Figure 1:
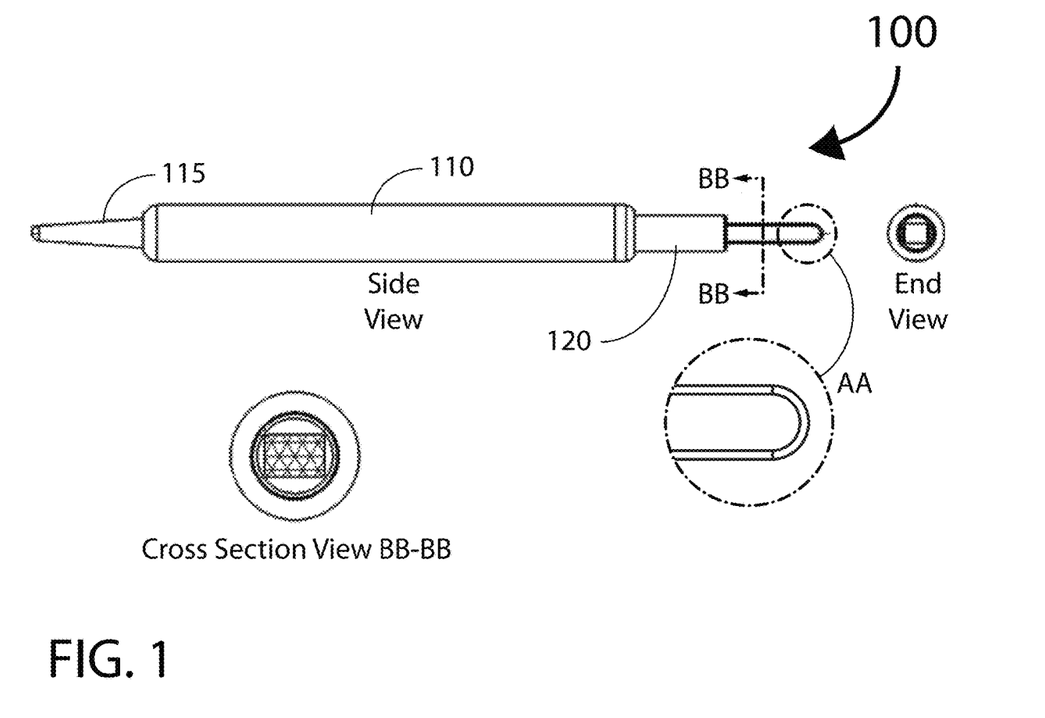
FIG. 1 is a simplified view illustrating the elements of a high density QFP test probe, greatly enlarged for easy viewing, in accordance with one embodiment of the present invention.

To facilitate discussion, FIG. 1 is a side view of one embodiment of a test probe intended for use with QFP packages. The probe 100 consists of a number of parts, a cylindrical housing 110 within which two contact pins 115 and 120 are fitted and a spring (not shown) which compresses at least one of the two contact pins. Contact pin 115 is a pin having a cylindrical form tapering to a relatively sharp point. This pin 115 slides into housing 110 against spring pressure and is intended to make contact with an interposer board that has contact pads which are connected to termination points to which are connected external test equipment. The pin is typically held captive within the housing by a crimped end that allows for movement but forms too small an orifice to allow the pin to escape.

At the other end of the housing, contact pin 120 is also of cylindrical form where it is inserted into and is held captive within housing 110. However, the contact tip of 120 is altered so as to form a rectangular section as shown in cross-section view BB-BB. This may be machined or stamped to form the rectangular section and the purpose of this will be seen later in this explanation. Instead of having a taper to a point as for contact pin 115, pin 120 has a different geometry which is designed to ensure that a device under test is properly connected to the test circuits.

In common with consumer grade devices, the connecting pins on a quad flat pack are intended for soldering and so the lead frame is tinned with a suitable material that is easily soldered using conventional techniques. In general, easily soldered materials that are low cost have a tendency to oxidize fairly quickly and so a typical soldering process involves a flux application (often integral with the solder paste or solder wire) that removes the oxide, chemically, when heat is applied, so ensuring a good quality, reliable soldered joint. The testing apparatus has no wet chemistry step and so a good quality connection must be made entirely by mechanical action. The probe system accommodates this requirement by having the probes set at a small angle to the intended contact point and, when the device under test is brought into contact with the probe tips they are compressed into their retaining sleeves under spring pressure. Because they are at an angle to the perpendicular, compression in the vertical direction yields a mechanical motion in the horizontal direction as well and this results in a scraping action on the leads or contacts of the device under test. The detail of "chisel" pin 120 is shown in greater detail as circled by magnified view AA, where a rounded tip end is shown. A number of profiles are possible that maximize reliability of connection whilst keeping the wear on the contact pins of the probe assembly within reason. This wear is unavoidable because of the mechanical friction at the contact area itself but good life may be achieved without sacrificing reliability.

In this embodiment, the "chisel" end of probe tip shown at AA can be rounded which means that the contact region is nominally the tangent line to the curve. It is seen that in practice the wear erodes this tangent line of contact into an area, but as this wear continues, the pressure at the contact point decreases until the contact is less reliable. To counter this, a second implementation has the tip of the pin modified so as to have a flat area parallel to the tangent line. This latter has the advantage that the fairly rapid wear rate exhibited at the early stages of use due to the relatively high pressure is avoided so repeatability is improved. It should be evident that the tangent line is nominally parallel to the interposer board that contacts the opposite end of the probe assembly.

Figure 2A:
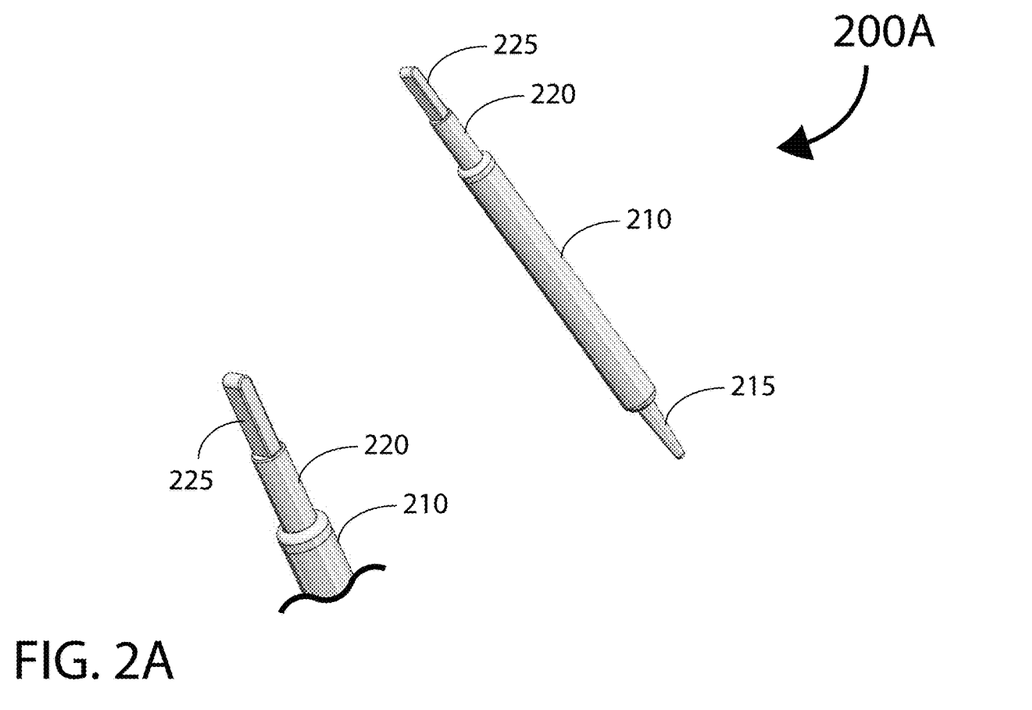
FIGS. 2A and 2B show two embodiments of the probe external detail with emphasis on the part that is used to contact the QFP connection pins.

FIG. 2A shows a couple of perspective views 200A of the probe pin 100 of FIG. 1. The cylindrical housing 210 retains the two contact pins 215 and 220. The ends of the pins within the housing are separated by a spring which allows at least one of the two pins to slide into the housing whilst providing the force to hold them securely against the connection points on the interposer board and the contact leads of the device under test. The cylindrical housing is conductive and in conjunction with the spring, which is also conductive, ensures that good electrical contact is made between the two contact pins 215 and 220 at all times. To aid in this, the inner surface of the cylindrical housing and the outer surface of the contact pins may be coated in a suitable material so as to resist oxidation or other detriment. Gold or Palladium are examples of such coating materials. If a hard, wear resistant surface is required, then Nickel may be used; in one implementation, the components are nickel plated and a fine plating of gold or palladium is applied on top of this.

In some embodiments, the outer surface of the cylindrical housing is passivated so as to insulate the housing of the probe from the retainer that secures the probes relative to the test jig. Anodizing is one example of a passivation process, but other coating techniques may be used; the probe housing does not move in operation and there is no wear on this outside surface between the probe and the retainer that supports the probes themselves.

In the embodiment illustrated by FIG. 2A, the tip 225 of pin 220 is seen to have a rectangular form and is also shown with a smoothly curved end. The rectangular form is simple to make and when engaged with the retaining housing, into which all the probe pins will be inserted, it resists turning so that the alignment of the tip is always certain. In general, the tip 225 of the pin 220 is plated in a similar fashion to the rest of the pin with the goal of durability and reliability of the connection quality. Wear on the leads of the QFP is irrelevant since the material that plates them is quite soft and the soldering process when the part is built on to a circuit board eliminates any wear effects.

Figure 2B:
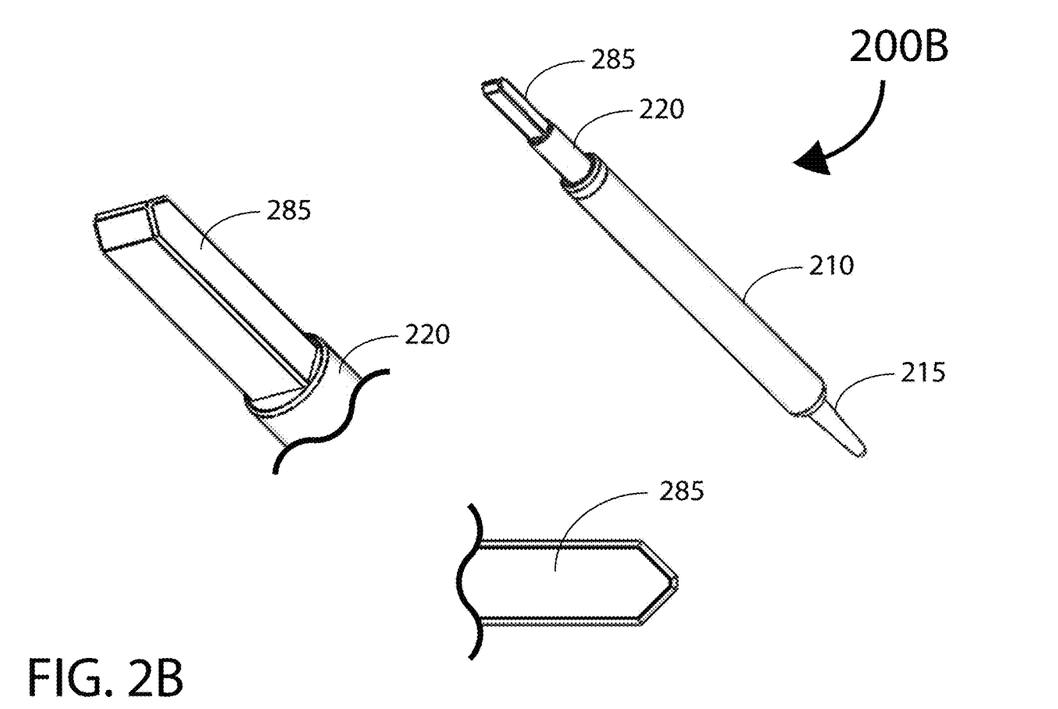

Referring now to FIG. 2B, in another embodiment, the tip 285 of pin 220 is seen to have a rectangular form and is shown with an alternate chamfered tip end profile. The rectangular form is simple to make and when engaged with the retaining housing, into which all the probe pins will be inserted, it resists turning so that the alignment of the tip is always certain. In general, the probe tip 285 is plated in a similar fashion to the rest of the pin with the goal of durability and reliability of the connection quality.

Other probe tip profiles are also contemplated within the spirit of the present invention (not shown). For example, the probe tip can be shaped so that it has a tapered land which is approximately parallel to the upper and lower surfaces of the retaining block that supports the collection of probes that are used in the testing jig to provide the angular displacement that ensures a highly repeatable sliding and/or scraping contact when the device under test is positioned on the jig.

Figure 3A:
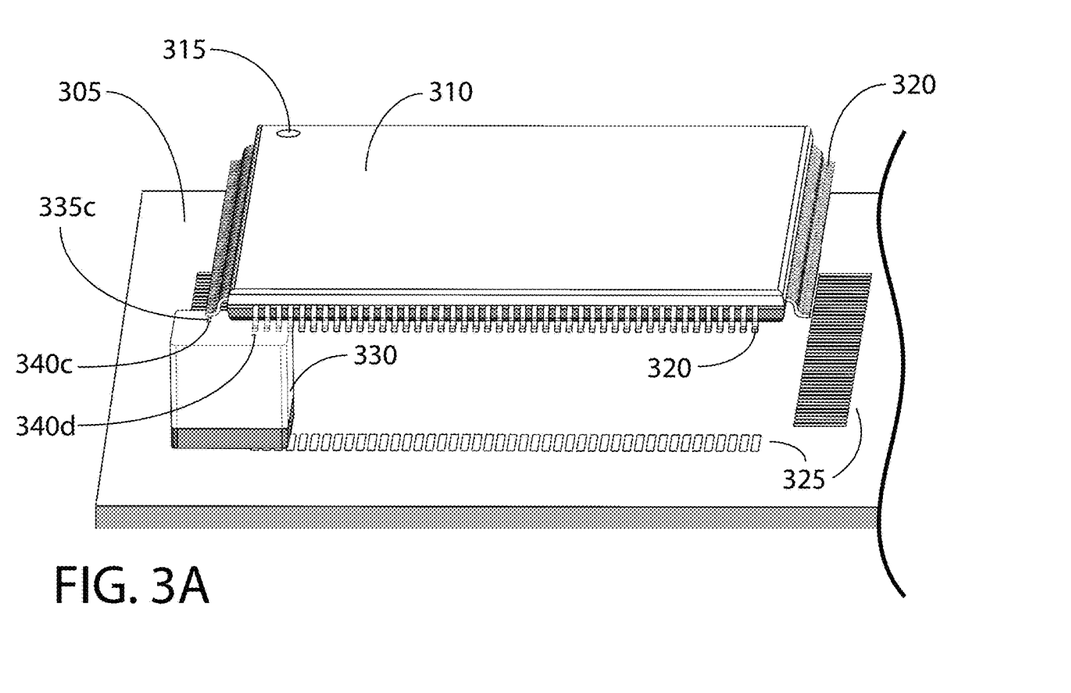
FIG. 3A shows an example test set up with the contact points for the interposer board, the partial probe retention block and one probe touching one of the connection pins of the QFP device.

Turning now to FIG. 3A, a typical quad flat pack integrated circuit is shown at 310. QFP details are freely available from any manufacturer and exact mechanical specifications form a normal part of a data sheet publication. The connection leads 320 or pins for coupling to the integrated circuit are positioned on each side of the package and it is usual for the package to be square in form having the same number of pins along each edge. It should be noted that the package can also be rectangular having one pair of opposite sides with one pin count while the remaining pair have a different pin count. In this figure, feature 315 is an identifying feature that is used to ensure correct package placement; typically in the pin numbering sequence for a packaged device a depression, bump or notch is used to indicate pin #1 and in an automated test set this feature is detected to ensure proper insertion orientation.

To connect test equipment to a test jig, in order to properly attach a miscellany of cables to the probes that will be used to contact a device that is to be tested, an interposer circuit board 305 is normally used. This allows for good quality cable termination to occur, including strain relief as well as any termination components such as resistors or reactive components to be fitted to ensure proper matching of critical signals such as high frequency signals or fast switching signals. Contact points 325 are usually located on the interposer board that are connected to the cables from the test equipment and in one implementation these contact points are positioned so as to correspond to the connection leads 320 or pins at the QFP device under test. A probe retainer 330 is machined so as to accommodate the probes and locate them so as to contact the interposer contact points 325 at the lower surface of the probe retainer 330. An aperture 340c of a plurality of probe apertures 340c ... 340d, located on the upper surface of probe retainer 330, allow the rectangular end section 335c of pin 220 to protrude from probe retainer 330.

Figure 3B:
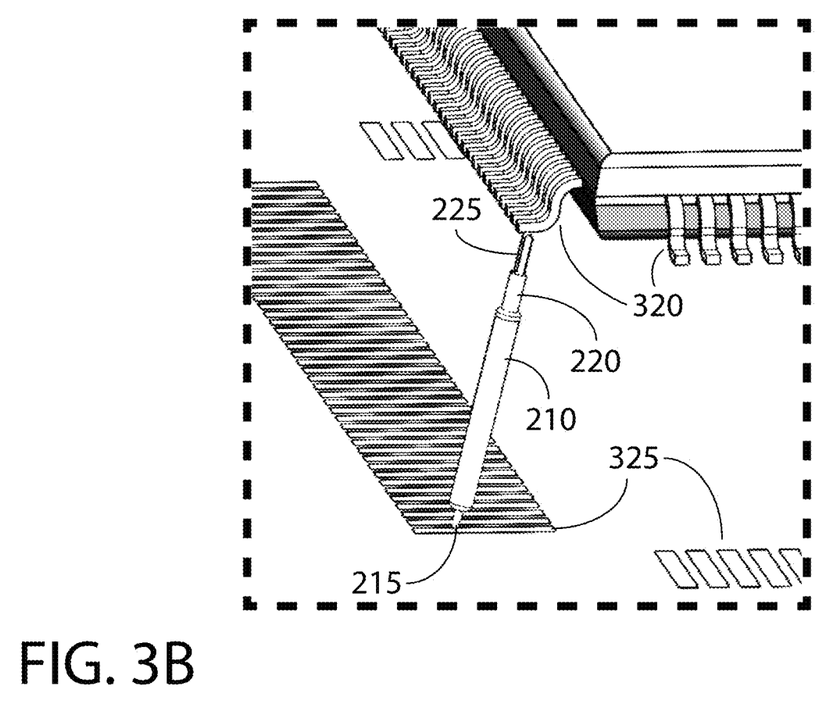
FIG. 3B shows an enlarged view of the connection between a probe element and a connection pin but without the probe retention block present so as not to obscure the detail.

FIG. 3B illustrates the location of one exemplary probe (depicted in suspense without the probe retainer) and shows the contact between the contact point 215 on the interposer board, the cylindrical housing 210 of the probe and the upper contact 220 of the probe to the protruding tip 225 thence to the connection lead 320 of the device under test. The angle from the normal is set by the geometry of the retainer (not shown) and in this figure the point of contact between the tip 225 and the connection lead 320 is shown as a smooth curve for simplicity. It will be appreciated that this tip may have a land of a predetermined starting area cut so as to be approximately parallel to the interposer circuit board 305 or the upper surface plane 332 of FIG. 3C. It should be appreciated that by using a broad contact line or area, some misalignment of the connecting leads 320 and the tip of the probe 225 can be tolerated. If a point were to be used, then misalignment by one half of the width of the connecting lead 320 would result in the connecting lead being displaced sideways and creating a distortion that might render the part unusable in production due to the risk of a solder short circuit during assembly.

Figure 3C:
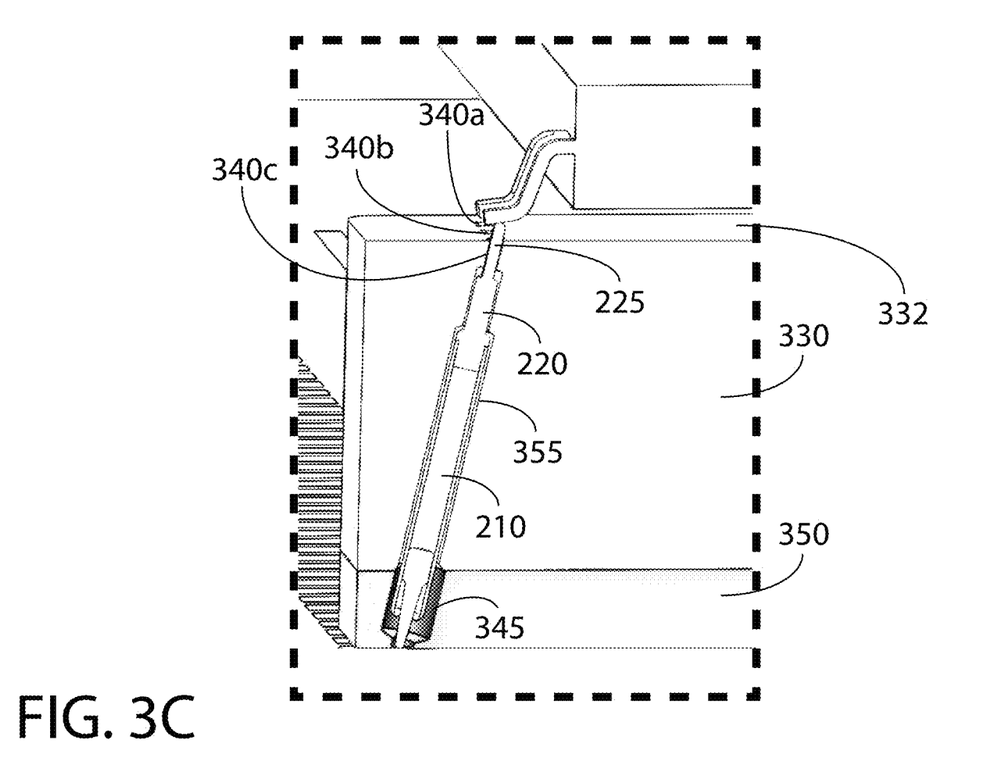
FIG. 3C shows a cutaway illustration of the probe assembly in the probe retention block using a simplified version of FIG. 3B.

Turning to FIG. 3C a cutaway detail of an exemplary probe 210 inserted into a machined pocket 355 in the retainer main block 330. The probe 210 is inserted into the main block 330 so that the rectangular section 225 of the upper contact pin 220 engages in the machined, approximately rectangular aperture 340c. The machined surfaces of the exemplary pocket and aperture can be passivated by a hard anodized layer that provides for electrical insulation between the retainer main block 330 and the individual probes, e.g., probe 210. Once all the required probes are inserted into the retainer main block, the lower block 350 is attached thus holding the probe pins captive in the retainer assembly. The retainer block complete with the populated probes is then fastened to the interposer board so that the lower contact points of the probes make contact with their designated contact pads 325 printed on the interposer board 305, and thence to the cabling to the test equipment. For clarity, the spring that holds the two contact pins of the probe apart and provides the required contact compliance is not shown.

Figure 4A:
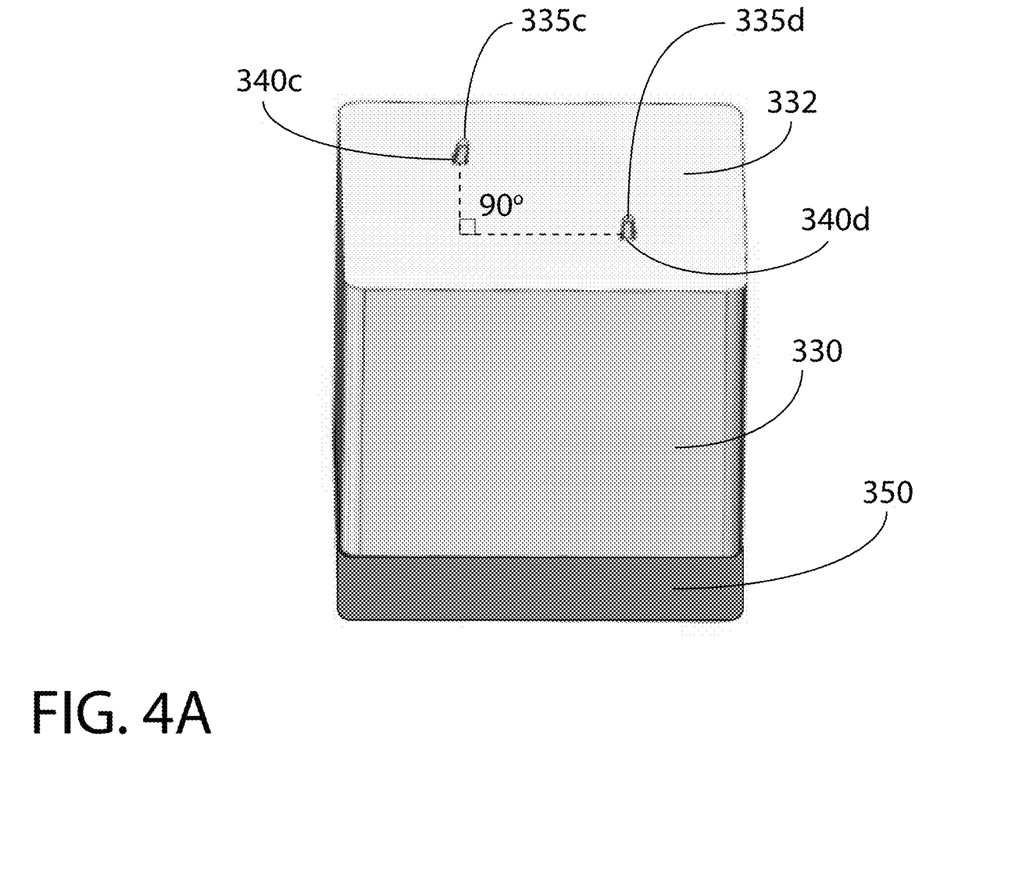
FIG. 4A illustrates the probe elements protruding through the surface of the probe retention block but without a device under test.
Figure 4B:
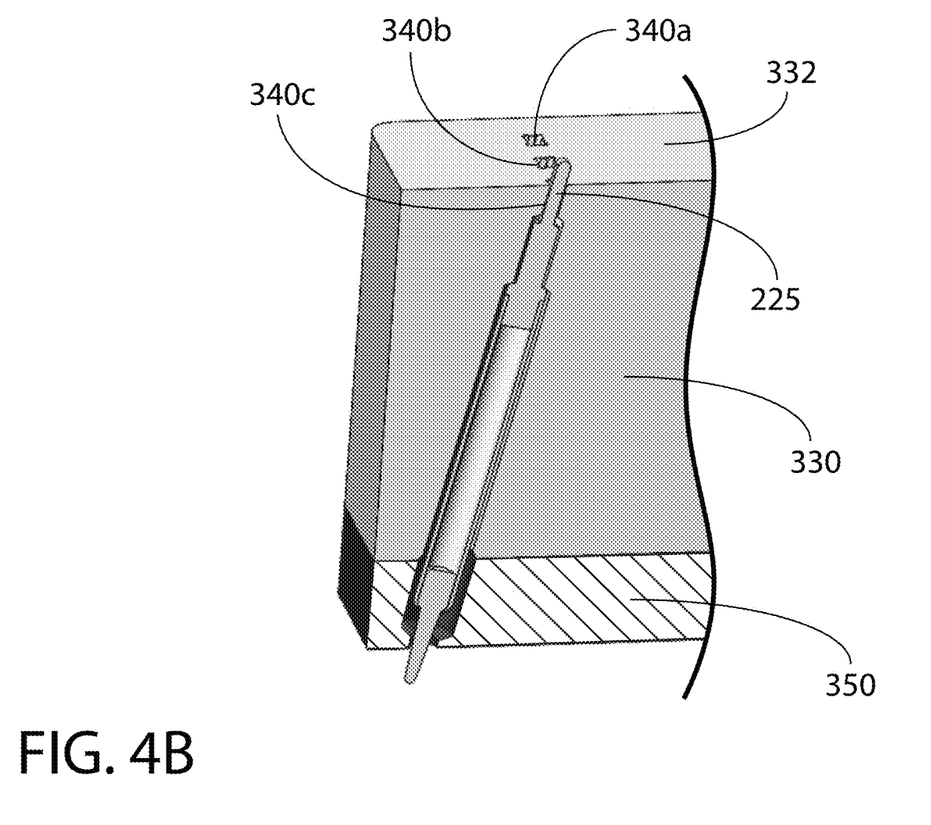
FIG. 4B shows a cutaway version of FIG. 4A to illustrate how the probe component is positioned within the probe retention block.

FIG. 4A shows the ends of two probe pin tips 335c, 335d protruding through respective apertures 340c, 340d located on the upper surface plane 332 of the retainer block 330. This figure illustrates the change in orientation of the probes at a corner of the retainer where there is a 90° rotation between the rectangular apertures 340c, 340d in the upper surface of the retainer block 330. FIG. 4B illustrates a row of three apertures 340a, 340b, 340c, including a cross-sectional view of aperture 340c accommodating probe tip 225. Again the spring or other elastic element between the two contact pins at either end is omitted to avoid confusion.

Test probe pins suitable for this application are highly miniaturized and in the configuration shown in this application are typically less than 0.25" in length when fully extended and less than 0.020" at their major diameter. In the preferred implementation the test pins are aligned in four single rows corresponding to the placement of the connection leads of a QFP device. In a second implementation the pins are aligned in two slightly offset rows on each of the four sides, with pins alternating so that odd numbered pins are in one row and even numbered pins are in the other row. This latter implementation allows for slightly more inter-pin spacing but requires a more complicated manufacturing process for the retaining block.

Figure 5:
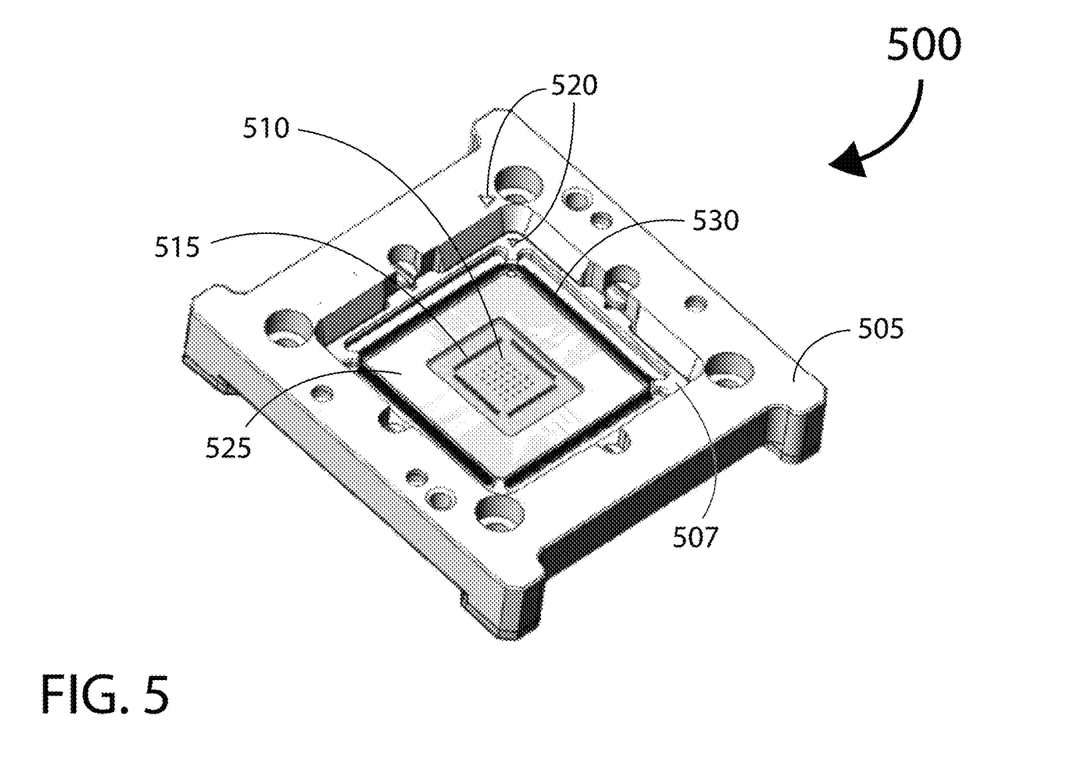
FIG. 5 shows the elements of the device retainer that locates and supports the device under test relative to the probe assembly.

FIG. 5 illustrates one design of a device handler test jig component 500 that serves the device under test (DUT) to the test jig for testing. The functions that this component must accomplish include collection and retention of the DUT, alignment of the DUT to avoid it being rotated from the correct position, registration of the DUT to ensure that the connection leads are properly placed with respect to the probes for testing and proper support for these connection leads to ensure that the lead alignment remains within the production specification. Once a test cycle is completed, this component must then return the DUT to its target location, for example a bin or collection point that is predetermined commensurate with the test results, then properly eject the DUT from the component.

There are several ways that a DUT can be delivered to the device handler 500 but once presented, the DUT must be secured in the correct position so that the location of the component leads corresponds with the proper test probe assignment. If a packaged device has a physical alignment element such as a single tapered corner designating pin 1, then an improperly aligned part will simply not seat properly. However if the alignment is simply a marking or feature that does not prevent misalignment then a mechanism is required that will preset the alignment before the DUT is placed in this device handler. Once the device is aligned and placed into the handler, a vacuum chuck 510 pulls the part firmly into position. Ejection pins 515 can be spring operated so that once the vacuum is released at the end of the test cycle the part is lifted away from the surface of the vacuum chuck to be deposited to a subsequent handling element. A properly seated DUT will lie with its upper surface flat against the bed 525 of this handler and the connection leads of the DUT will be held firmly against the surrounding lead support 530. When the handler engages the DUT with the test probes, the contact force is resisted by this lead support 530 so that the leads themselves cannot be bent or distorted during this engagement cycle.

An improperly positioned DUT risks damage to the test probes and subsequent delay in testing due to the time needed to repair or replace the test probe assembly. Misalignment is detected by the DUT's failure to sit flat against the bed 525 and this prevents the desired vacuum from forming. This excess pressure may be detected and a fault indication provided in response. This also detects the presence of any foreign matter that may prevent the DUT from seating properly and reduces the likelihood of uncorrected malfunction. Inspection of FIG. 5 reveals that the handler is comprised of two major sub-assemblies, a holder 505 which matches the test jig mechanical fittings and a DUT-specific retainer 507 that is changeable. Alignment marks 520 ensure that reassembly after service or replacement does not cause gross positioning error due to any asymmetry in this part. In this particular figure, the retainer 507 is secured to the holder 505 using screws to provide clamping force, but other methods may be used so long as the two sub-assemblies are firmly secured. It is found that by making this handler in two parts that the versatility is improved and set-up for minor DUT package changes greatly eased.

While this invention has been described in terms of several embodiments, there are alterations, modifications, permutations, and substitute equivalents, which fall within the scope of this invention. For example, many modifications are possible and the above described features from the various embodiments can be useful alone or in combination. Although sub-section titles have been provided to aid in the description of the invention, these titles are merely illustrative and are not intended to limit the scope of the present invention.

It should also be noted that there are many alternative ways of implementing the methods and apparatuses of the present invention. It is therefore intended that the following appended claims be interpreted as including all such alterations, modifications, permutations, and substitute equivalents as fall within the true spirit and scope of the present invention.

What is claimed is:

1. A test probe assembly useful for testing a packaged integrated circuit (IC) device under test (DUT), the test probe assembly comprising:
    a probe retainer having a plurality of probe retention cavities, and wherein the plurality of probe retention cavities are slanted relative to a vertical axis of the probe retainer;
    a plurality of slanted compressible probes configured to repeatedly maintain reliable electrical contact with a corresponding plurality of DUT contacts when under a vertical compliant force along the vertical axis of the probe retainer, each of the probes having a probe barrel which is contained within a corresponding one of the plurality of probe retention cavities, and oppositely extending upper and lower probe tips, and wherein at least one of the oppositely extending upper and lower probe tips of each of the probes being depressible in the probe barrel;
    wherein each of the upper probe tips includes an upper end section with a rectangular cross-section and a flat elongated chisel-shaped tip end, wherein each of the probe retention cavities includes a corresponding rectangular cross-section aperture enabling the flat elongated chisel-shaped tip end to protrude from a top surface of the probe retainer, wherein the flat elongated chisel-shaped tip end is substantially parallel to an extended contact plane of one of the corresponding plurality of DUT contacts, thereby enabling the flat elongated chisel-shaped tip end to provide a mechanical scraping action with the one of the corresponding plurality of DUT contacts when subject to the vertical compliant force, the flat elongated chisel-shaped tip end distributing the compliant force and extending the mechanical scraping action over the contact plane to minimize gouging of the one of the corresponding plurality of DUT contacts; and
    wherein each of the upper probe tips includes a mid-section adjacent to the upper end section, and wherein a diagonal of the rectangular cross-section of the upper end section is not greater than a diameter of a round cross-section of the mid-section.

2. The test probe assembly of claim 1 wherein the chisel-shaped tip end is rounded.

3. The test probe assembly of claim 1 wherein the chisel-shaped tip end is chamfered.

4. The test probe assembly of claim 1 wherein the lower probe tips are tapered, and wherein the probe assembly includes a lower block with a plurality of cylindrical channels for securing the lower probe tips.

5. The test probe assembly of claim 1 wherein a first subset of the plurality of probe retention cavities are opposingly slanted with respect to a second subset of the plurality of probe retention cavities.

6. The test probe assembly of claim 1 wherein chisel-shaped tip ends of a first subset of the plurality of probes are configured to be arranged at 90 degrees with respect to chisel-shaped tip ends of a second subset of the plurality of probes.

* * * * *